(12) United States Patent
Werner (10) Patent No.: US 6,252,773 B1
(45) Date of Patent: Jun. 26, 2001

(54) HEAT SINK ATTACHMENT APPARATUS AND METHOD

(75) Inventor: Paul L. Werner, Rowlett, TX (US)

(73) Assignee: Lucent Technologies, Inc, Murray Hill, NJ (US)

( * ) Notice: Subject to any disclaimer, the term of this patent is extended or adjusted under 35 U.S.C. 154(b) by 0 days.

(21) Appl. No.: 09/298,427

(22) Filed: Apr. 23, 1999

(51) Int. Cl.[7] ...................................................... H05K 7/20
(52) U.S. Cl. ..................... 361/704; 165/185; 174/16.3; 257/719; 257/727; 361/710
(58) Field of Search ...................... 165/80.2, 80.3, 165/185; 174/163; 257/706–707, 712–713, 718–719, 726–727; 360/690, 704, 707, 709–710, 717–722, 807–810

(56) References Cited

U.S. PATENT DOCUMENTS

| | | | |
|---|---|---|---|
| 4,602,315 | * 7/1986 | Breese | 361/707 |
| 5,172,756 | * 12/1992 | Jayamanne et al. | 165/80.3 |
| 5,343,362 | * 8/1994 | Sulbery | 361/610 |
| 5,775,418 | * 7/1998 | Lonergan et al. | 361/710 |
| 5,909,358 | * 6/1999 | Bradt | 361/707 |
| 5,986,888 | * 11/1999 | Amaro et al. | 361/704 |
| 5,991,151 | * 11/1999 | Capriz | 361/704 |

* cited by examiner

Primary Examiner—Gregory Thompson (57) ABSTRACT

The present invention provides a heat transfer device for cooling an electronic component mounted to a substrate. The present invention also provides for a method to cool electronic components by using the heat transfer device and a method to manufacture the heat transfer device. In one embodiment, the heat transfer device comprises an elongated body having opposing first and second major surfaces and opposing first and second minor surfaces; a mounting recess extending along a length of the second minor surface; a first ledge extending from the first major surface and defining a first component mounting area of a first lateral dimension; and a second ledge extending from the second major surface and defining a second component mounting area of a second lateral dimension, the second dimension differing from the first dimension.

29 Claims, 10 Drawing Sheets

HEAT SINK ATTACHMENT APPARATUS AND METHOD

TECHNICAL FIELD OF THE INVENTION

The present invention is directed, in general, to a heat transfer device and, more specifically, to a heat transfer device that can be used alone or as a unit in a modular heat control system.

BACKGROUND OF THE INVENTION

A principle concern of electronic circuit designers is controlling the heat that is generated during operation of the circuit. Control of heat is vital to prevent component or circuit failure caused by heat buildup. The generally preferred method to control circuit and component heat is to dissipate it into the atmosphere around the circuit before temperatures rise to a damaging level. To do this, designers usually associate heat transfer devices, such as heat sinks, with heat generating components in the circuit. Heat sinks are designed to absorb the heat from the components and radiate the heat into the surrounding atmosphere.

Heat transfer devices are generally composed of a material with favorable heat transfer, or thermal conductive, characteristics; that is, the material should be able to absorb heat and radiate heat into the surrounding atmosphere in an efficient manner. Several metals have favorable thermal conductive characteristics, including copper, aluminum, steel, and their alloys. Any one of these materials can be used as a heat sink, but aluminum is generally the preferred material because copper is expensive and steel is not very malleable. Another reason aluminum is favored is that extrusion processes are preferred in the manufacture of heat transfer devices, and such processes favor aluminum.

Commercially available heat transfer devices come in a variety of shapes and sizes. Designers have developed a number of methods to combine these commercially available devices with heat generating circuits and components. These methods have generally been satisfactory, except in the case of low profile electronic systems. It has been found that very few of the commercially available heat transfer devices are suitable for controlling the heat generated by a large number of components in a very limited space.

Most commercially available heat transfer devices can control the heat of only one or two electronic components. This means that several heat transfer devices may be required for a single circuit. This may be acceptable for larger electronic systems, but is a distinct disadvantage where the electronic system is a compact or low profile system for which space is limited.

In many cases, heat spreaders can be mounted on the circuit substrate with heat generating components mounted on the spreaders. In the case of compact systems, such spreaders frequently have to be specially designed, which increases the cost of the system and may create ancillary storage and handling problems during manufacture. These spreaders are frequently combined with custom heat transfer devices in the design of heat control systems.

When custom heat transfer devices are used, the devices and their associated electronic components are typically assembled with clamps, nuts and screws, any one of which fastening methods involves a large number of small difficult to handle parts. This type of conventional assembly process requires several small parts to be meticulously handled with the aid of customized jigs, fixtures and other hand tools. This type of handling generally complicates the manufacturing process and makes it slower, more costly and inherently less reliable. Additionally, it can be anticipated that a number of completed circuits will be rejected for quality control reasons because leads become bent or misaligned due to vibration and handling.

Accordingly, what is needed in the art is a heat transfer device that can be associated with a circuit and the heat generating components on the circuit using a simple attachment method requiring the use of substantially fewer parts in the assembly process than prior art methods. The device should advantageously handle a number of heat generating components and should lend itself to being used in the manufacture of low profile systems. Such a device would be most advantageously employed if it could also function as a component in combination with other devices in a heat control system as well as a stand alone heat control device.

SUMMARY OF THE INVENTION

To address the above-discussed deficiencies of the prior art, the present invention provides a heat transfer device for cooling an electronic component mounted to a substrate. The present invention also provides for a method to cool electronic components by using the heat transfer device and a method to manufacture the heat transfer device. One embodiment of the heat transfer device comprises an elongated body having opposing first and second major surfaces and opposing first and second minor surfaces; a mounting recess extending along a length of the second minor surface; a first ledge extending from the first major surface and defining a first component mounting area of a first lateral dimension; and a second ledge extending from the second major surface and defining a second component mounting area of a second lateral dimension, the second dimension differing from the first dimension.

In broad scope, the present invention introduces a heat transfer device that can function either on a stand alone basis or as a component of a larger heat transfer system. In particular, the device has several favorable characteristics that provide a distinct advantage over prior art when used in low profile electronic systems. The device can be used alone as a heat transfer device to which heat generating components are attached, or it can be combined with other commercially available heat sinks to provide heat control for a larger number of devices. Because it can be used on a circuit in lieu of spreaders, it permits the design and manufacture of circuits using fewer parts, which provides a distinct cost advantage.

Included among the invention's various embodiments is a version of the device with the mounting recess configured to also serve as a cooling channel. Another embodiment provides for a channel extending along the length of the first minor surface, which channel is configured to dissipate heat and provide a receptacle for a spring clip to secure components to the device. Other aspects of the invention provide receptacles for spring clips to be used to secure components to the device. In one such aspect, a first auxiliary ledge extends from the first major surface to parallel the first ledge and define a spring clip receptacle for a spring clip to secure components to the device. In another version, the device has a second auxiliary ledge extending from the second major surface to parallel the second ledge and define a spring clip receptacle for a spring clip to secure components to the device.

A particularly advantageous iteration of the invention provides for pins that are press fit into the mounting recess, which pins are used to mount the device on a substrate by press fitting the pins into holes on the substrate. Another advantageous iteration of the device permits a heat sink to be releasably fastened to the first ledge or to the second ledge.

The present invention also provides a method for cooling an electronic component mounted to a substrate. When the heat transfer device is fastened to a substrate, other heat transfer devices can be combined with it in a modular system, which can be advantageously employed with low profile or compact electronic systems.

Also claimed is a method to manufacture the heat transfer device claimed herein. The claimed method calls for extruding the device, which extrusion can include any number of the various embodiments claimed. The fact that the extrusion can be cut to any length deemed necessary is a particularly attractive and desirable feature of the invention. It permits the device to be tailored to the size of the substrate on which it will be mounted as well as the number of components with which it will be combined.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
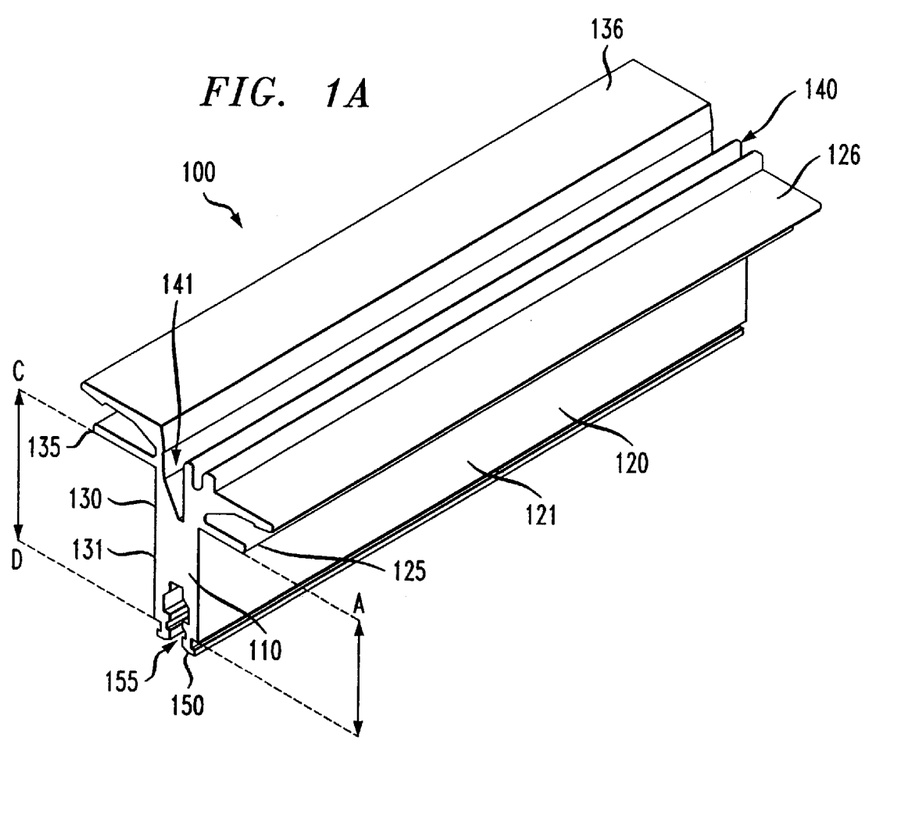
FIG. 1A illustrates an isometric view of a heat transfer device constructed according to the principles of the present invention.

Referring initially to FIG. 1A, illustrated is an isometric view of a heat transfer device 100 constructed according to the principles of the present invention. The device 100 represents a particularly favorable embodiment of the present invention. The device 100 has an elongated body 110 with opposing first and second major surfaces 120, 130 and opposing first and second minor surfaces 140, 150. To mount the device 100 to a substrate, a mounting recess 155 extends along the length of the second minor surface 150.

Defining a first component mounting area 121 of a first lateral dimension (indicated by the A–B notation), a first ledge 125 extends from the first major surface 120 of the device 100. A second component mounting area 131 of a second lateral dimension (indicated by the C–D notation) is defined by a second ledge 135 extending from the second major surface 130. The first lateral dimension A-B differs from the second lateral dimension C–D so that two different sizes of heat generating components can be mounted on the heat transfer device 100. For example, one side can mount only the shorter TO-220 electronic components while the other can accommodate both TO-220 components as well as the larger TO-247 components.

A beneficial aspect of the illustrated embodiment of the device 100 is the number of cooling features incorporated into the device's 100 structure. One such feature is the cooling channel 141 that runs along the length of the first minor surface 140. The mounting recess 155 is also configured to serve as a cooling channel that runs the length of the second minor surface 150. Other cooling features include the first auxiliary ledge 126 that extends from the first major surface 120 parallel to the first ledge 125. The second auxiliary ledge 136 extending from the second major surface 130 parallel to the second ledge 135. Those skilled in the art will recognize that the combined surface area of the first major surface 120, second major surface 130, first ledge 125, second ledge 135, first auxiliary ledge 126, second auxiliary ledge 136, cooling channel 141, and mounting recess 155 provides sufficient surface area so that the illustrated device 100 can serve as a stand alone heat sink. When combined with the other features of this invention as hereinafter described, this stand alone feature represents a significant advantage over prior art because of its increased surface area.

Figure 1B:
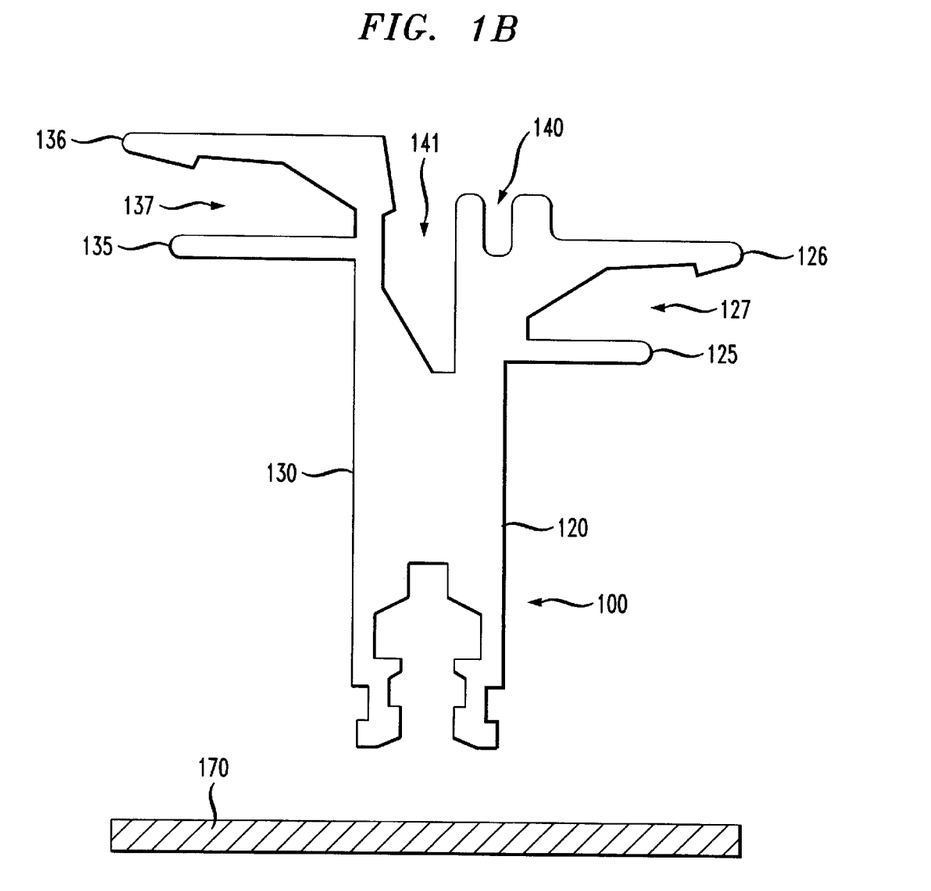
FIG. 1B illustrates an end elevational view of the heat transfer device of FIG. 1A.

Turning now to FIG. 1B, illustrated is an end elevational view of the heat transfer device 100 of FIG. 1A. To visualize how the device 100 relates to the substrate 170 of a printed wiring or circuit board, the device 100 is illustrated in a suspended position over the substrate 170 on which it is to be mounted.

The relationship between the first ledge 125 and the first auxiliary ledge 126, both of which extend from the first major surface 120, is clear in this FIG. 1B, as is the relationship between the second ledge 135 and second auxiliary ledge 136 extending from the second major surface 130. The first ledge 125 and first auxiliary ledge 126 are shaped to define a receptacle 127 that receives a spring clip securing components to the device 100. A similar receptacle 137 is defined by the second ledge 135 and second auxiliary ledge 136 on the second major surface. A similar receptacle 141 is also formed by the cooling channel 141 that extends along the length of the first minor surface 140. All three of the receptacles 127, 137, 141 have a similar shape to receive the same type of spring clip and secure components or other devices to the heat transfer device 100.

Figure 1C:
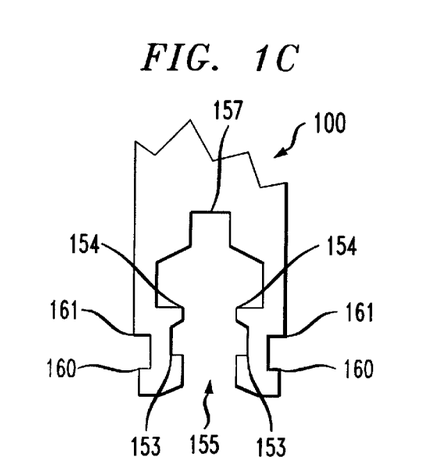
FIG. 1C illustrates an end elevational view of the mounting recess of one embodiment of the heat transfer device.

Turning to FIG. 1C, illustrated is an end elevational view of the mounting recess 155 of one embodiment of the heat transfer device 100. The mounting recess has first and second snap grooves 153, 154 inside the mounting recess. This permits the heat transfer device 100 to be mounted on a substrate in two stages. In the first stage the first snap grooves 153 can secure the heat transfer device 100 in a partially mounted position in order to make more room for working around the heat transfer device 100 during the assembly process. When it is determined that the heat transfer device 100 is ready to be completely installed, the second snap grooves 154 hold the device 100 in its fully installed position together with the external snap fit 160. At the top of the mounting recess is a pin stop channel 157 to receive the top of pins in the substrate that the heat transfer device 100 is mounted upon. The exterior also has an insulator alignment groove 161 to properly align the heat transfer device.

Figure 2A:
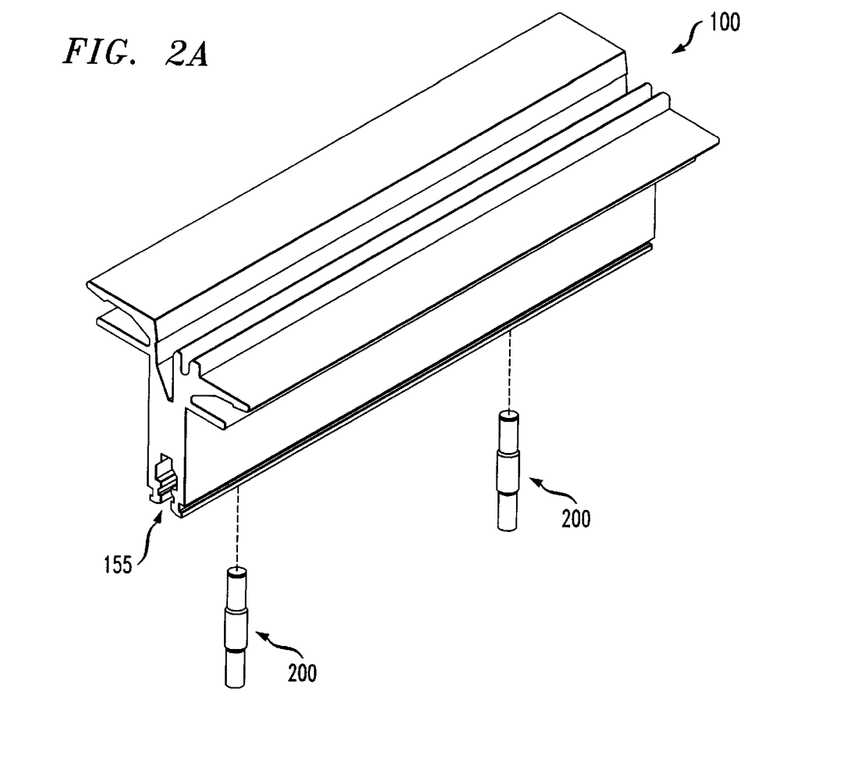
FIG. 2A illustrates an isometric view of the heat transfer device of FIG. 1A, along with mounting pins that may be employed to mount the heat transfer device to a substrate.

Turning now to FIG. 2A, illustrated is an isometric view of the heat transfer device 100 of FIG. 1A, along with mounting pins 200 that may be employed to mount the heat transfer device 100 to a substrate. One end of the pin 200 may be press-fitted into the mounting recess 155 on the device 100. The other end of the pin 200 may then be positioned in a hole on the substrate provided for this purpose and then soldered.

Figure 2B:
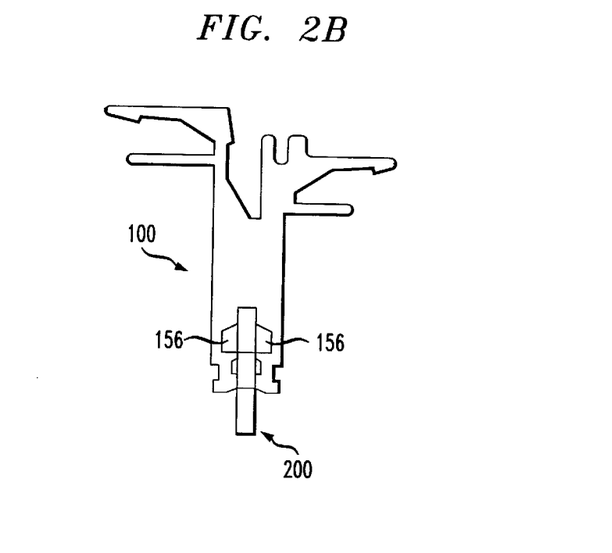
FIG. 2B illustrates a sectional view of the solderable mounting pins of FIG. 2A engaged within the mounting recess of the heat transfer device of FIGS. 1A or 2A.

Turning now to FIG. 2B, illustrated is a sectional end view of the mounting pins 200 of FIG. 2A engaged within the mounting recess 155 of the heat transfer device 100 of FIGS. 1A or 2A. The mounting recess 155 on this embodiment of the device 100 has channels 156 around the pins 200 that provide an air bypass route for air to circulate through the mounting recess 155 with pins 200 installed. This feature provides additional cooling when the device 100 is mounted on a substrate by conduction as well as convection. When pins 200 are soldered to the substrate, the pins 200 provide an additional cooling mechanism because it provides a conduction route to the copper planes of the substrate. The mounting recess 155 is designed so that the pins 200 length is precisely controlled when they are inserted to stop at pin stop 157 as shown on FIG. 1C. The channels 156 in the mounting recess 155, in conjunction with the pins 200 enhance heat transfer characteristics by changing laminar air flow to turbulent air flow.

Figure 3A:
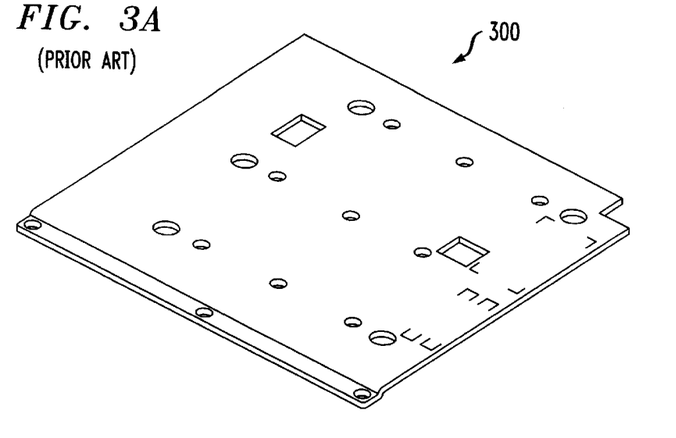
FIG. 3A illustrates an isometric view of a prior art heat sink top plate cover for an assembled electronic circuit.

Turning now to FIG. 3A, illustrated is an isometric view of a heatsink top plate cover 300 for an assembled electronic circuit (not illustrated). The cover 300 is placed over a circuit by fastening it to the top of one or more spreaders 350 of the type illustrated in FIG. 3B with many screws 361, nuts 363, and clamps 362.

Figure 3B:
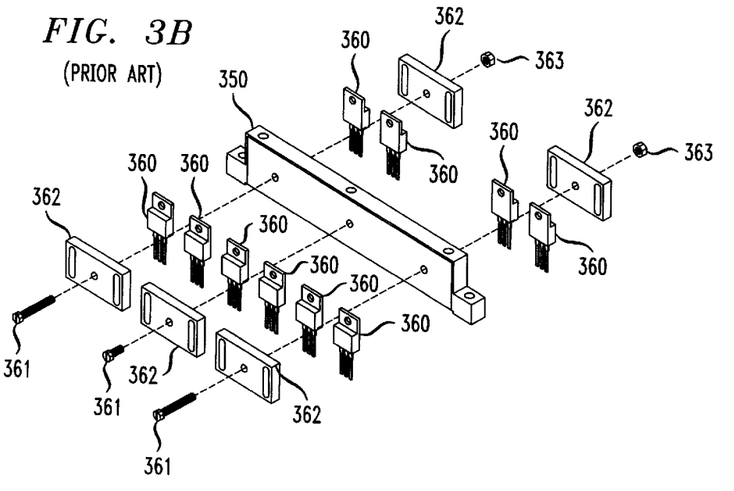
FIG. 3B illustrates an exploded isometric view of a prior art spreader assembly that may be employed with the heat sink top plate cover of FIG. 3A.
Figure 3C:
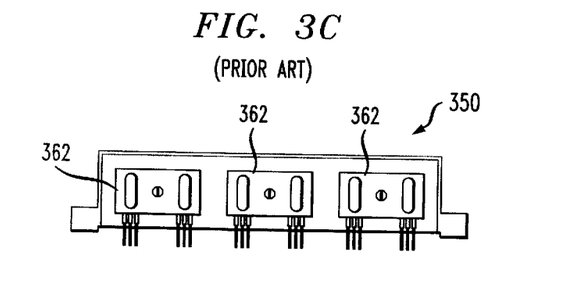
FIG. 3C illustrates a front elevational view of the prior art spreader assembly of FIG. 3B.

FIG. 3B illustrates an exploded isometric view of a prior art spreader assembly that may be employed with the cover 300 of FIG. 3A. FIG. 3B shows a prior art spreader 350 with the various parts and heat generating components 360 that are required to be assembled in the course of completing an electronic assembly. FIG. 3C illustrates the assembled spreader 350 with electronic components 360 mounted thereon by retainers 362. The components 360 are fastened to the spreader 350 by inserting small screws 361 through retainers 362 that hold the components 360 in place, and then through the spreader 350. The screws 361 are secured to the spreader 350 by small nuts 363. The spreader 350, with components 360 attached, is fastened to a substrate, over which a cover 300 is placed by attaching it to the top of one or more spreaders 350 by multiple screws (not shown).

There are a number of disadvantages in using spreaders 350 and covers 300 to assemble electronic systems, particularly in the case of compact systems. First, the total height of the assembled electronic system should advantageously be at least equal to the height of the tallest electronic component on the substrate, frequently a capacitor or magnetic element. If the desired system height is less than the height of the tallest component, a hole should advantageously be cut in the top plate heat sink cover 300 to accommodate the component. An additional disadvantage of covers 300 of the type illustrated, is that most electronic systems require custom made covers 300 that cannot be used on other products. This means that a limited number of pieces in a product line will require a small number of covers 300, with a relatively high cost to make each cover 300. It also complicates inventory control when a number of products are being manufactured if each product requires a different cover. Because the heat transfer device 100 described herein can eliminate the requirement for individually designed covers 300, the cost to manufacture certain electronic systems can be reduced.

The number of small parts required to complete a spreader 350 assembly is apparent in FIG. 3B. When a heat spreader 350 assembly, such as that illustrated, requires a number of small parts, the total assembly cost is increased because of the additional labor required. As will be hereinafter described, the present invention offers the opportunity to reduce complexity so no additional fixtures, pneumatic tools or complex assembly procedures are required to complete an electronic system. Costs are further reduced because fixtures do not have to be stored.

Figure 4A:
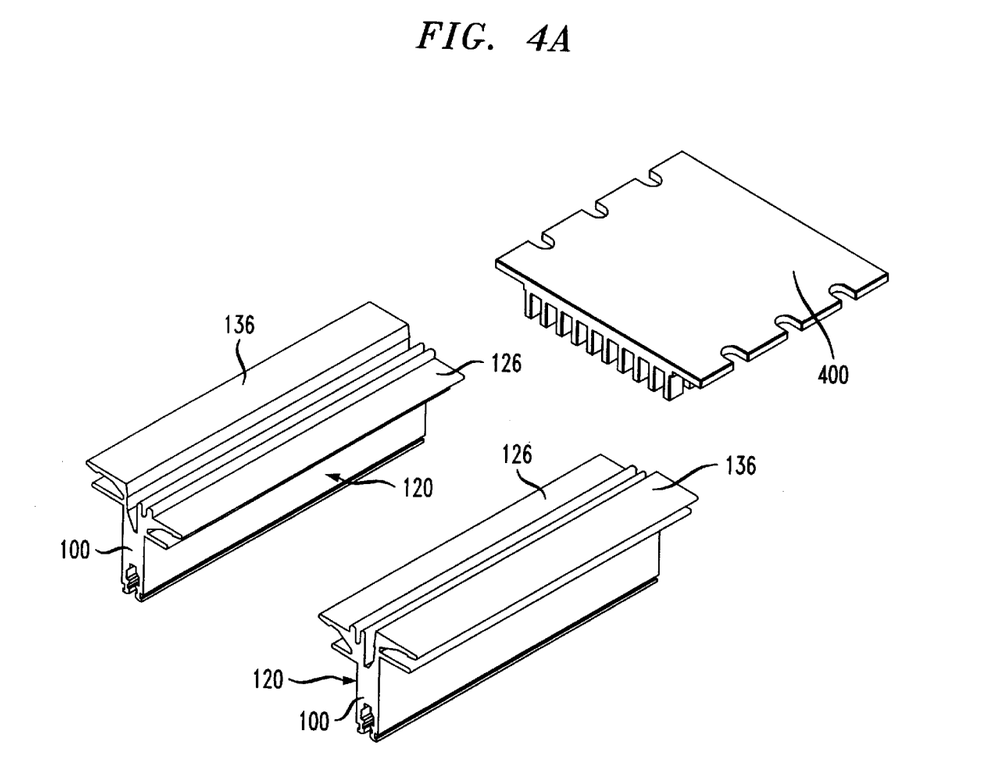
FIG. 4A illustrates an exploded isometric view of two heat transfer devices of the type illustrated in FIGS. 1A and 2A and a commercially available heat sink.
Figure 4B:
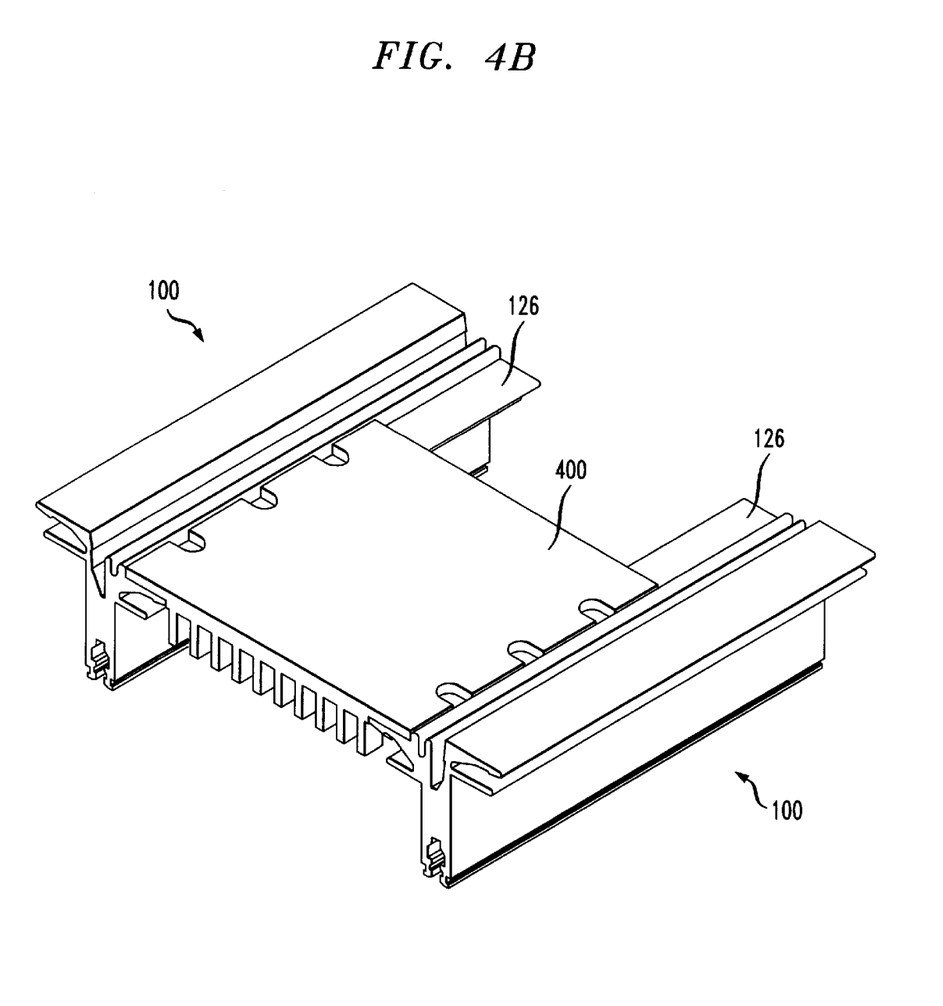
FIG. 4B illustrates an assembled isometric view of the assembly of FIG. 4A.
Figure 4C:
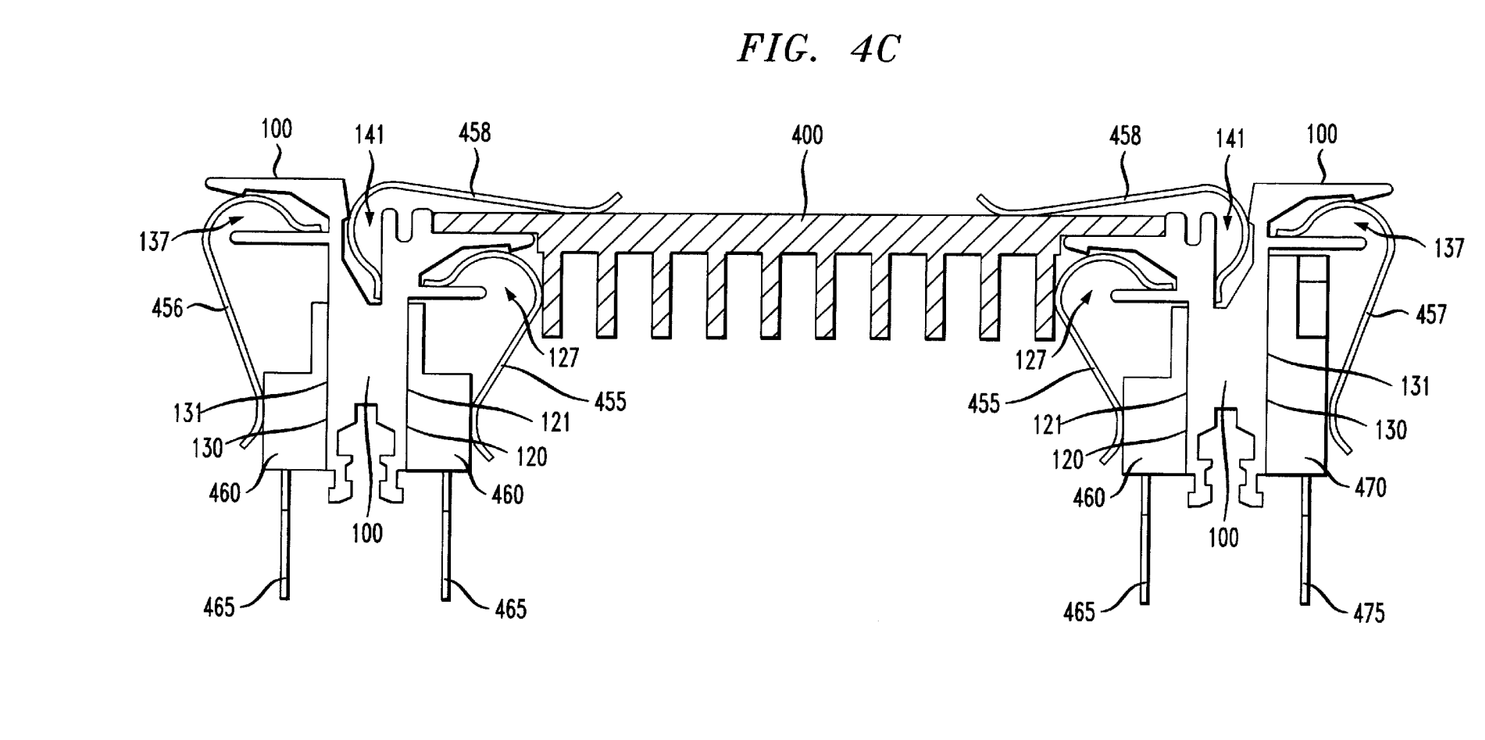
FIG. 4C illustrates an end view of the assembly of FIG. 4B, and two sizes of electronic components held in place by spring clips.

Turning now to FIGS. 4A through 4C, an advantageous embodiment of the invention is illustrated that addresses certain of the prior art problems discussed above. Illustrated are two heat transfer devices 100 that are to be mounted on a substrate and a commercially available heat sink 400 to provide additional cooling. The commercial heat sink 400 also serves as a heat transfer device and protective cover for all or a portion of the circuit. FIG. 4A illustrates an exploded isometric view of two heat transfer devices 100 of the type illustrated in FIGS. 1A and 2A and a commercially available heat sink 400. The first major surface 120 on each device 100 is illustrated as facing the first major surface 120 on the other device 100. When placed in this position, the auxiliary ledges 126 on each device 100 are of the same height and opposite one another. The heat sink 400 is mounted on the devices 100 using the auxiliary ledges 126 for support.

Turning now to FIG. 4B, illustrated is an assembled isometric view of the assembly of FIG. 4A. Clearly illustrated is the use of the heat sink 400 as a top plate cover. Because the current invention can be manufactured using an extrusion process, heat transfer devices 100 can be cut to different lengths. These different length devices 100 can be combined with different designs and sizes of commercially available mass produced heat sinks 400 to permit circuit designers to use this embodiment of the invention in lieu of custom-made top heat sink covers 300.

Turning now to FIG. 4C, illustrated is an end view of the assembly of FIG. 4B, and two sizes of electronic components 460, 470 held in place by spring clips 455, 456, 457. The spring clips 455, 456, and 457 are used to secure the components 460 and 470 and spring clip 458 secures the heat sink 400 to the devices 100. The spring clips 455, 457, 458 may be substantially the same if each of three spring receptacles 127, 137, 141 are substantially identical.

Two advantageous features of this embodiment of the invention are illustrated in FIG. 4C. First, the device 100 permits two different sizes of heat generating components 460, 470 to be fastened to its major surfaces 120, 130. This is possible because two different sizes of component mounting areas 121, 131 are provided. The first component mounting area 121 on the first major surface 120 has a heat generating component 460 of one size mounted thereon, while mounted on the second component mounting area 131 on the second major surface 130 is a larger heat generating component 470.

The second advantageous feature illustrated in FIG. 4C is the way the electronic components 460, 470 and heat sink 400 are fastened to the device 100. The ability to fasten the various components 400, 460, 470 to the devices 100 with spring clips substantially reduces the number of parts required to complete an electronic assembly and, because clips go on easily, the assembly process is improved. These two features are particularly advantageous when used in subcompact electronic assemblies.

At this time, the best mode for using the invention illustrated herein is to combine it with the heat sink mounting apparatus described in copending U.S. patent application Ser. No. U.S. Ser. No. 09/298,373, entitled "Heat Sink Alignment Apparatus and Method", commonly assigned with the present invention and incorporated herein by reference.

Extending from each electronic component 460, 470 are electrical leads 465, 475 to provide electrical connectivity between the components 460, 470 and the circuit on the substrate on which the device 100 is mounted. One embodiment of the device described in the above-referenced copending patent application provides for guides to align and connect the leads 465, 475 to the substrate.

A method to manufacture the invention illustrated herein is to use an extrusion process. When the device 100 is formed by extrusion, the device 100 can be tailored to a desired length based on the size of the substrate on which it is mounted and the number and size of electronic components 460, 470 to be cooled. Extrusion can include any number of, or variation on, the various embodiments claimed herein. The actual method of manufacturing the device 100 is clear from the foregoing detailed description and illustrations.

In summary, the present invention introduces a heat transfer device 100 that, as described herein, can function either on a stand alone basis or as a component of a larger heat transfer system. Because the device 100 has an abundance of cooling surface, it can be used alone as a heat transfer device to which heat generating components are attached, or it can be combined with other commercially available heat sinks to provide heat control for a larger number of electronic components. The design permits the device 100 to be used on a circuit in lieu of heat spreaders, which do not make good stand alone heat sinks, while permitting the design and manufacture of circuits using fewer parts and labor, both of which provide a distinct cost advantage. In addition, the device 100 has features that provide a distinct advantage over prior art devices when used in low profile electronic systems.

Figure 4D:
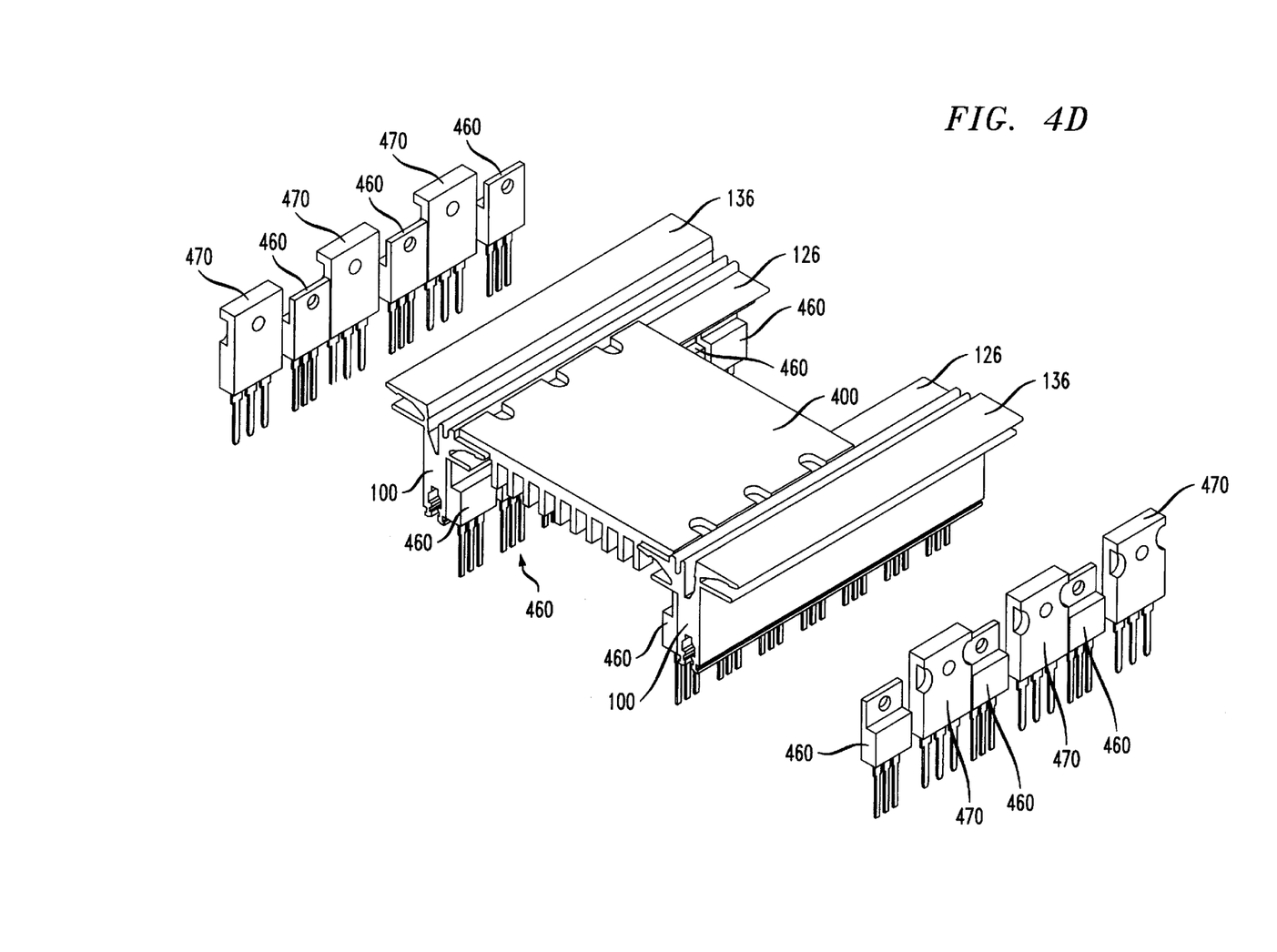
FIG. 4D illustrates an isometric view of a configuration of two heat transfer devices of the type illustrated in FIGS. 1A and 2A, a commercially available heat sink, and electronic components of two different common sizes to be mounted thereon.
Figure 4E:
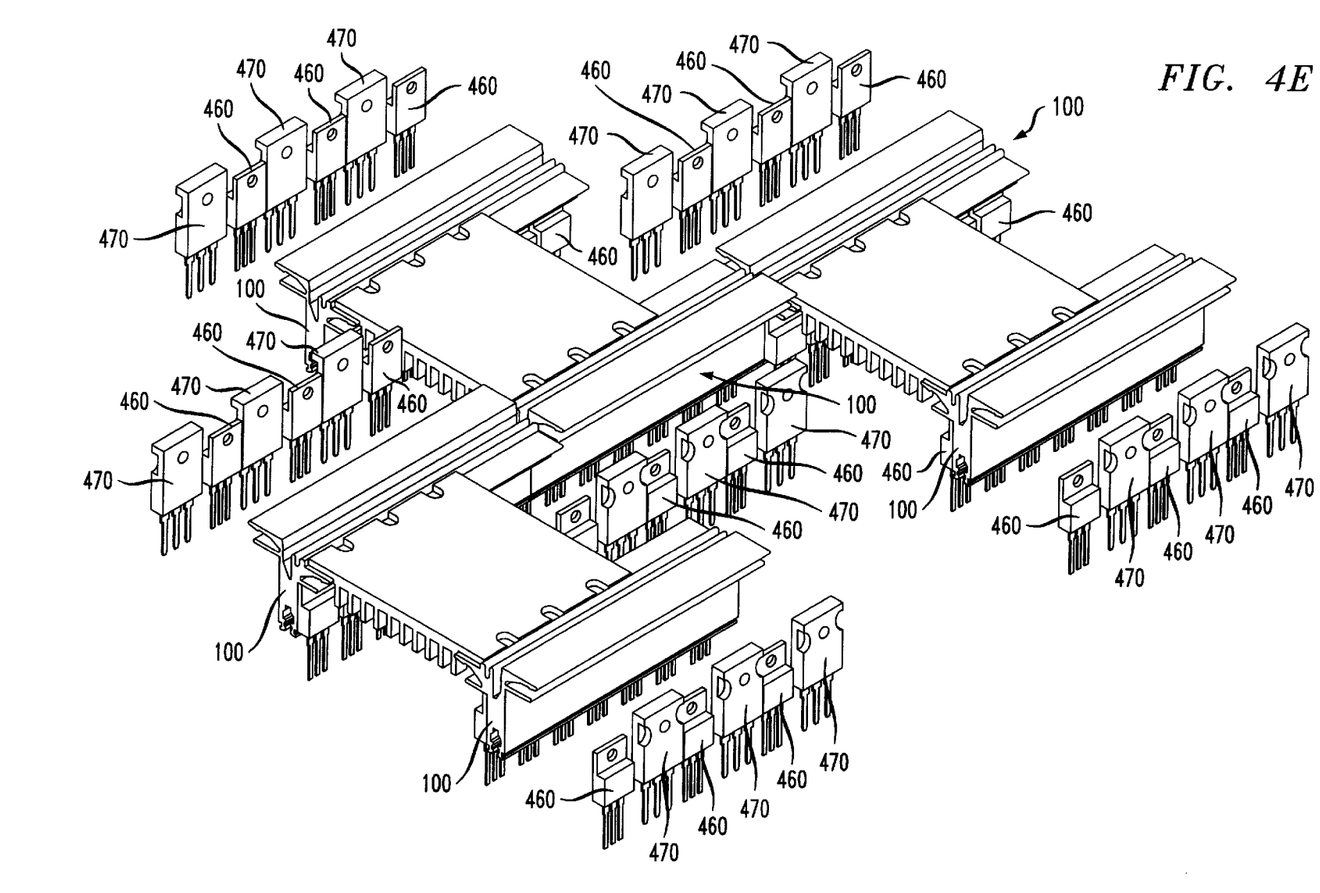
FIG. 4E illustrates an isometric view of an alternative configuration of heat transfer devices of the type illustrated in FIGS. 1A and 2A, commercially available heat sinks, and a number of electronic components to be mounted thereon.
Figure 4F:
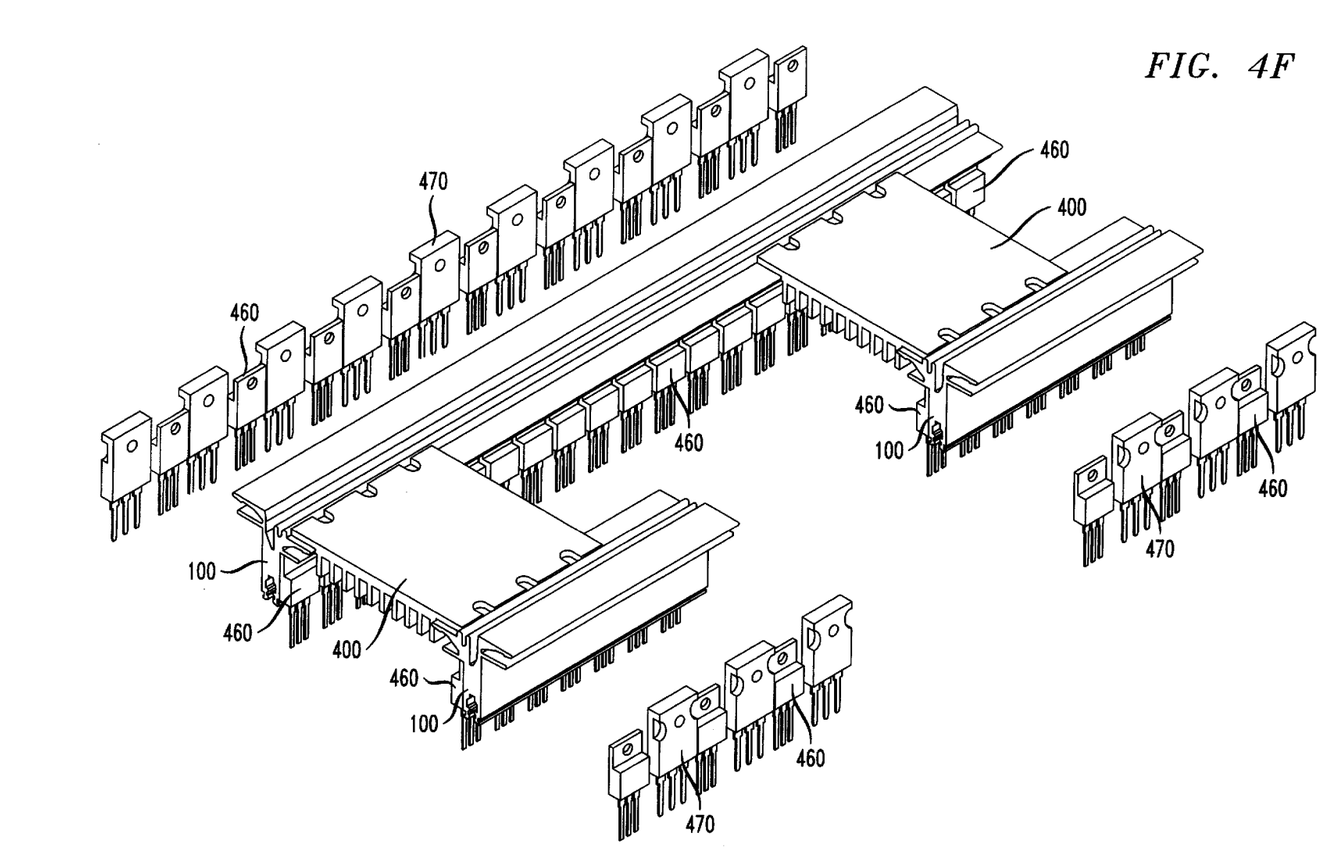
FIG. 4F illustrates an isometric view of another alternative configuration of heat transfer devices of the type illustrated in FIGS. 1A and 2A, commercially available heat sinks, and electronic components to be mounted thereon.

Turning now to FIGS. 4D, 4E, and 4F, illustrated are various configurations of heat transfer devices, commercially available heat sinks, and electronic components made possible by the present invention. The illustrated configurations clearly demonstrate the usefulness, versatility and flexibility of the invention. Of course, other configurations are clearly within the scope of the present invention.

Although the present invention has been described in detail, those skilled in the art should understand that they can make various changes, substitutions and alterations herein without departing from the spirit and scope of the invention in its broadest form.

What is claimed is:

1. For use in cooling an electronic component mounted to a substrate, a heat transfer device, comprising:
    an elongated body having opposing first and second major surfaces and opposing first and second minor surfaces, a mounting recess extending along the longitudinal length of said second minor surface; and
    a first ledge extending from said first major surface and defining a first component mounting area of a first lateral dimension; and
    a second ledge extending from said second major surface and defining a second component mounting area of a second lateral dimension, said second dimension differing from said first dimension.

2. The device as recited in claim 1 wherein said mounting recess is a cooling channel.

3. The device as recited in claim 1 wherein a channel extends along the length of said first minor surface, said channel constituting a receptacle for a spring clip to secure components to said device.

4. The device as recited in claim 1 wherein a first auxiliary ledge extends from said first major surface, said first auxiliary ledge paralleling said first ledge and defining a receptacle for a spring clip to secure components to said device.

5. The device as recited in claim 1 wherein a second auxiliary ledge extends from said second major surface, said second auxiliary ledge paralleling said second ledge and defining a receptacle for a spring clip to secure components to said device.

6. The device as recited in claim 1 wherein pins are press fit in said mounting recess to mount said device on a substrate by press fitting said pins in holes on said substrate.

7. The device as recited in claim 4 wherein a heat sink is releasably fastened to said first auxiliary ledge.

8. The device as recited in claim 5 wherein a heat sink is releasably fastened to said second auxiliary ledge.

9. An electronic circuit comprising:
    two or more heat generating electronic components;
    a substrate;
    a heat transfer device for use in cooling said two or more heat generating electronic components mounted to said substrate, including:
        an elongated body having opposing first and second major surfaces and opposing first and second minor surfaces, a mounting recess extending along the longitudinal length of said second minor surface;
        a first ledge extending from said first major surface and defining a first component mounting area of a first lateral dimension; and a second ledge extending from said second major surface and defining a second component mounting area of a second lateral dimension, said second dimension differing from said first dimension.

10. The device as recited in claim 9 wherein said mounting recess is a cooling channel.

11. The device as recited in claim 9 wherein a channel extends along the length of said first minor surface, said channel constituting a receptacle for a spring clip to secure components to said device.

12. The device as recited in claim 9 wherein a first auxiliary ledge extends from said first major surface, said first auxiliary ledge paralleling said first ledge and defining a receptacle for a spring clip to secure components to said device.

13. The device as recited in claim 9 wherein a second auxiliary ledge extends from said second major surface, said second auxiliary ledge paralleling said second ledge and defining a receptacle for a spring clip to secure components to said device.

14. The device as recited in claim 9 wherein pins are press fit in said mounting recess to mount said device on said substrate by press fitting said pins in holes on said substrate.

15. The device as recited in claim 12 wherein a heat sink is releasably fastened to said first auxiliary ledge.

16. The device as recited in claim 13 wherein a heat sink is releasably fastened to said second auxiliary ledge.

17. A method for cooling an electronic component mounted to a substrate, comprising:
fastening a heat transfer device to said substrate, said heat transfer device including:
an elongated body having opposing first and second major surfaces and opposing first and second minor surfaces, a mounting recess extending along the longitudinal length of said second minor surface;
a first ledge extending from said first major surface and defining a first component mounting area of a first lateral dimension; and
a second ledge extending from said second major surface and defining a second component mounting area of a second lateral dimension, said second dimension differing from said first dimension.

18. The method as recited in claim 17 wherein said mounting recess is a cooling channel.

19. The method as recited in claim 17 wherein a channel extends along the length of said first minor surface, said channel constituting a receptacle for a spring clip to secure components to said device.

20. The method as recited in claim 17 wherein a first auxiliary ledge extends from said first major surface, said first auxiliary ledge paralleling said first ledge and defining a receptacle for a spring clip to secure components to said device.

21. The method as recited in claim 17 wherein a second auxiliary ledge extends from said second major surface, said second auxiliary ledge paralleling said second ledge and defining a receptacle for a spring clip to secure components to said device.

22. The method as recited in claim 17 wherein pins are press fit in said mounting recess to mount said device on said substrate by press fitting said pins in holes on said substrate.

23. The method as recited in claim 20 wherein a heat sink is releasably fastened to said first auxiliary ledge.

24. The device as recited in claim 21 wherein a heat sink is releasably fastened to said second auxiliary ledge.

25. A method for manufacturing a heat transfer device for cooling an electronic component mounted to a substrate, comprising:
forming an extrusion having;
an elongated body;
opposing first and second major surfaces and opposing first and second minor surfaces, with a mounting recess extending along the longitudinal length of said second minor surface;
a first ledge extending from said first major surface and defining a first component mounting area of a first lateral dimension;
a second ledge extending from said second major surface and defining a second component mounting area of a second lateral dimension, said second dimension differing from said first dimension; and
cutting said extrusion to a predetermined length.

26. The method as recited in claim 25 wherein said mounting recess is a cooling channel.

27. The method as recited in claim 25 wherein a channel is formed along the length of said first minor surface, said channel constituting a receptacle for a spring clip to secure components to said device.

28. The method as recited in claim 25 wherein a first auxiliary ledge is formed to extend from said first major surface, said first auxiliary ledge paralleling said first ledge and defining a receptacle for a spring clip to secure components to said device.

29. The method as recited in claim 25 wherein a second auxiliary ledge is formed to extend from said second major surface, said second auxiliary ledge paralleling said second ledge and defining a receptacle for a spring clip to secure components to said device.

* * * * *